United States Patent [19]

Rose

[11] 3,821,785

[45] June 28, 1974

[54] SEMICONDUCTOR STRUCTURE WITH BUMPS

[75] Inventor: Ralph Edward Rose, San Jose, Calif.

[73] Assignee: Signetics Corporation, Sunnyvale, Calif.

[22] Filed: Mar. 27, 1972

[21] Appl. No.: 238,116

[52] U.S. Cl. .................... 357/67, 357/68, 357/71
[51] Int. Cl. .................... H01l 5/00
[58] Field of Search .................... 317/234

[56] References Cited

UNITED STATES PATENTS

| | | | |
|---|---|---|---|
| 3,429,029 | 2/1969 | Langdon et al. | 29/589 |
| 3,480,412 | 11/1969 | Duffek et al. | 29/195 |
| 3,509,428 | 4/1970 | Mankarious et al. | 317/234 |
| 3,622,385 | 11/1971 | Stork | 117/217 |

*Primary Examiner*—Rudolph V. Rolinec
*Assistant Examiner*—E. Wojciechowicz
*Attorney, Agent, or Firm*—Flehr, Hohbach, Test, Albritton & Herbert

[57] ABSTRACT

Semiconductor structure having a semiconductor body with a planar surface and with metallic contact pads formed over the surface. A layer of insulating material is formed over the contact pads. Bumps or pillars are formed which extend through the layer of insulating material and are bonded to the contact pads. The bumps or pillars are formed of a relatively ductile aluminum layer. A base portion is secured to the ductile layer and has a mushroom-shaped configuration. Gold-tin layers are carried by the base and form a gold-tin system so that the bumps or pillars can be readily bonded to the lead frames.

In the method, a semiconductor body is provided having a planar surface and having metallic contact pads formed over the surface. An insulating layer is formed over the contact pads. Openings are formed in the insulating layer. Bumps or pillars are formed which extend through the openings in the insulating material and make contact with and are secured to the pads. The bumps or pillars are formed by first forming a relatively thick aluminum layer making contact with the pads and then forming bases which are secured to the relatively thick aluminum layers. Gold-tin layers are formed on the bases to provide a gold-tin system. During the formation of the base and the gold-tin layers, a layer of photoresist is provided so that the bumps or pillars assume a mushroom-shaped configuration.

18 Claims, 18 Drawing Figures

SEMICONDUCTOR STRUCTURE WITH BUMPS

BACKGROUND OF THE INVENTION

Attempts have heretofore been made to provide bumps or pillars on semiconductor devices to overcome the disadvantages of conventional bonding by the use of thin gold wires. However, it has been found with such bumps or pillars that when they are placed under thermal stress they have a tendency to shear off. In cases where the pillar did not shear off, there were cases where the pillars or bumps would break. There is, therefore, a need for a new and improved pillar or bump construction which can be utilized in connection with semiconductor structures.

SUMMARY AND OBJECTS OF THE INVENTION

The semiconductor structure consists of a semiconductor body which has a planar surface having metallic contact pads formed over the surface. A layer of insulating material overlies the contact pads. The layer is provided with windows overlying the pads and exposing the pads. A relatively thick ductile layer of aluminum is formed on said layer of insulating material and extends into said opening and makes contact with said contact pads. A base is secured to said relatively thick aluminum layer and has a surface spaced a substantial distance above the aluminum layer. Gold-tin layers are carried by the base. The base with the gold-tin layers form bumps or pillars which can be utilized for bonding the semiconductor body to a lead frame. The bumps or pillars are shaped so that the gold does not come into contact with the aluminum.

In general, it is an object of the present invention to provide a semiconductor structure which is provided with bumps or pillars which can withstand thermal cycling without breaking or shearing.

Another object of the invention is to provide a semiconductor structure of the above character in which nickel is utilized in the bump or pillar construction and in which means is provided for preventing diffusion of the nickel through the aluminum.

Another object of the invention is to provide a structure and method of the above character in which chromium is utilized to prevent nickel from diffusing into the aluminum.

Another object of the invention is to provide a structure and method of the above character in which the chromium is protected by a nickel layer.

Another object of the invention is to provide a structure and method of the above character in which the gold-tin eutectic can be shifted to accommodate various types of packaging for the semiconductor structure.

Another object of the invention is to provide a structure and method of the above character in which the tin is protected by the gold so that it cannot oxidize.

Another object of the invention is to provide a structure and method of the above character in which the aluminum layer remains ductile.

Another object of the invention is to provide a structure and method of the above character which uses a controlled collapse reflow soldering system in bonding the bumps to leads extending to the outside world.

Additional objects and features of the invention will appear from the following description in which the preferred embodiments are set forth in detail in conjunction with the the accompanying drawings.

BRIEF DESCRIPTION OF THE PREFERRED EMBODIMENT

The process and method for fabricating a semiconductor structure with bumps incorporating the present invention is shown in FIGS. 1 through 18. In connection with the process, a semiconductor body 21 of a suitable type such as one formed of silicon is utilized. It is assumed in connection with the present invention process that all of the processing steps required to complete the semiconductor device or integrated circuit in the semiconductor body 21 have been completed in a manner well known to those skilled in the art such as shown in Pat. No. 3,619,739. Typically, the silicon is provided with an impurity of one conductivity type therein. Regions of opposite impurity are formed in the semiconductor body either by diffusion or ion implantation to provide dish-shaped regions (not shown) defined by PN junctions which are also dish-shaped and which extend to the planar surface 22 of the semi conductor body. Typically, the semiconductor body itself would serve as the collector and the first region of opposite conductivity type would serve as the base of a transistor. A region of first conductivity type would then be formed within the region of opposite conductivity type also defined by a dish-shaped PN junction extending to the surface 22 to provide the emitter of the transistor. Other devices can be formed in the semiconductor body simultaneously or at different times, as for example, diodes or resistors and the like to provide the desired integrated circuit.

Figure 17:
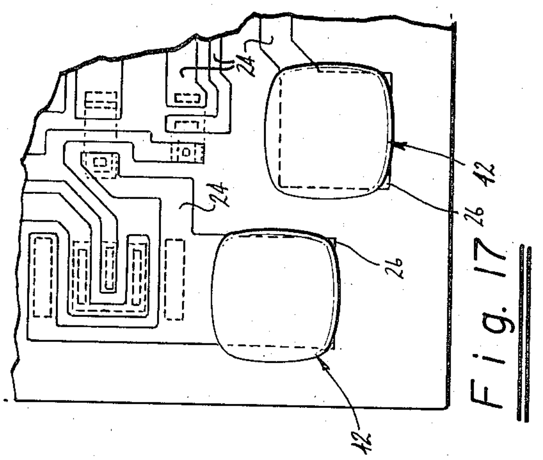
FIG. 17 is a plan view of a portion of an integrated circuit having bumps or pillars formed thereon incorporating the present invention.

After the devices have been formed an insulating layer 23 of a suitable material such as thermally grown silicon dioxide is formed on the surface 22. Thereafter, openings are formed in the layer 23 to expose portions of the surface 22 overlying portions of said regions forming the semiconductor devices. A layer of metal of a suitable type such as aluminum is then evaporated onto the surface of the layer 23 and into the openings which have been formed in the layer 23 to make contact with said regions. By the use of a mask and suitable photolithographic techniques, the undesired metal is removed so that there remain leads 24 which are adherent to the surface of the insulating layer 23. The leads extend into and are formed integral with pads 26 which are generally rectangular in shape. As shown in FIG. 17, the pads 26 are spaced around the outer periphery of the semiconductor body 21 and the leads 24 extend inwardly from the pads to make contact with the various regions of the devices forming the integrated circuit. The pads are generally rectangular in shape and also are formed of the same material as the leads as, for example, aluminum. The aluminum is formed to a suitable thickness as, for example, 1 micron. The semiconductor structure in this stage is shown in FIG. 1 and as thus far described is conventional.

Figures 1, 2, 3, 4, 5, 6, 7, 8, 9, 10, 11, 12:
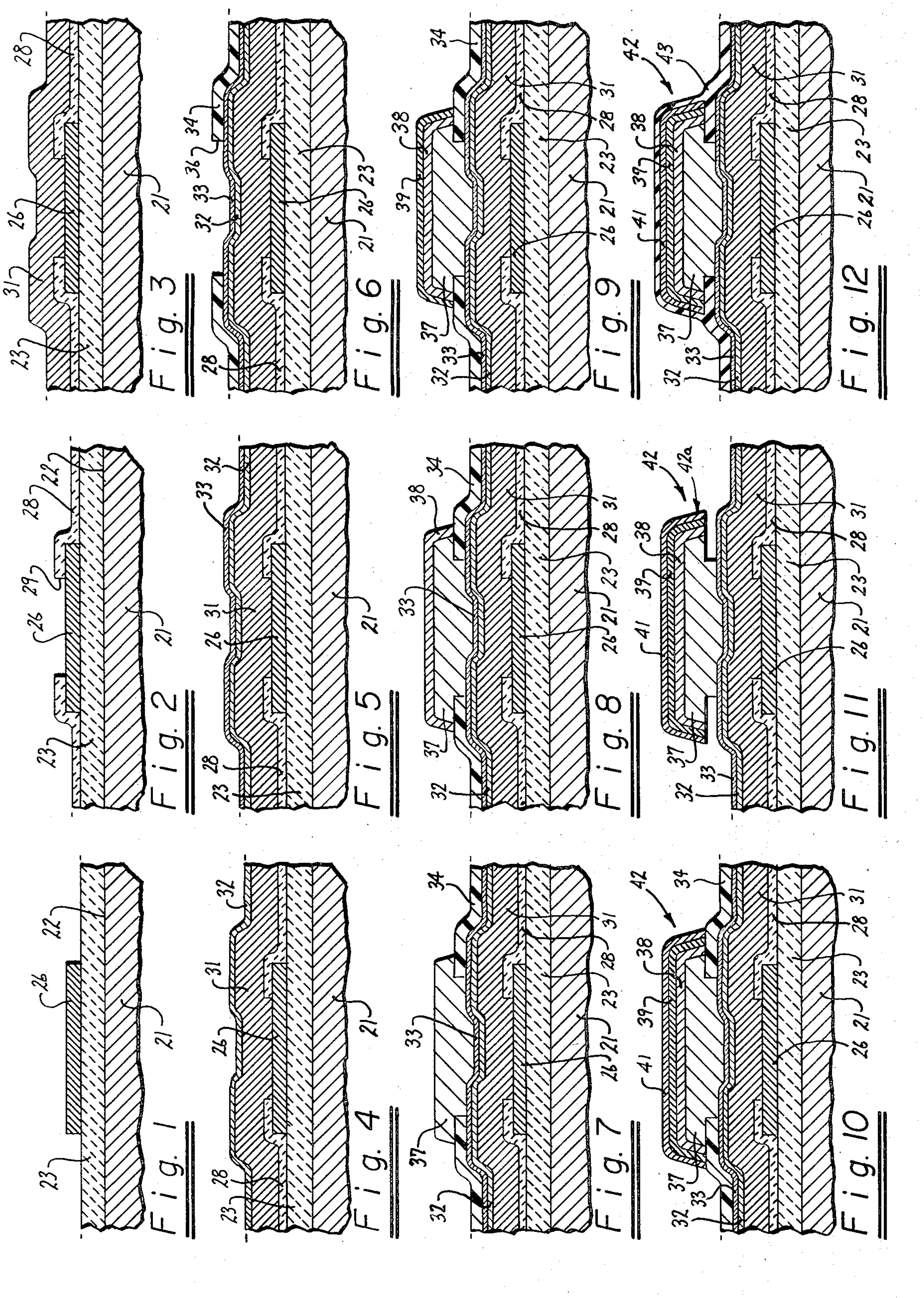

Thus, the present process commences with the steps shown in FIG. 2 in which a layer 28 of glass is deposited over the surface of the silicon dioxide layer 23 and also over the lead structure 24 and the pads to a suitable thickness, as, for example, 1 micron. Contact windows or openings 29 are then formed in the glass layer 28 which overlie and expose portions of the pads 26 so that contact can be made to the pads. The formation of the windows or openings 29 is accomplished in a conventional manner such as by utilizing a mask and a suitable negative photoresist such as KTFR. The photoresist is exposed through the mask and the undesired portion of the photoresist removed so that a photoresist mask is provided to permit etching of the glass with a suitable solution such as an HF ethylene glycol water solution with a minimum of attack on the aluminum. After the etching is completed, the photoresist is removed by an organic stripper.

It should be pointed out that at the stage of the semiconductor structure shown in FIG. 1, the alloying step normally practiced after metallization has not been carried out. Rather, the alloying step is carried out after the glass has been deposited in FIG. 2. This alloying step serves two functions: one, it provides a strong bond between the deposited glass and the aluminum interconnect structure; and two, it helps to provide a clean surface on the deposited glass. This latter function is accomplished because the alloying step removes any traces of photoresist residue which have not been removed chemically. It is important that the exposed surface of the deposited glass be as clean as possible to obtain a maximum adhesion between the aluminum layer thereafter deposited, and the layer 28. The alloying step is carried out at a suitable temperature such as from 450 to 500°C. for a suitable period of time as, for example, one-half hour.

After the windows 29 have been formed, and the alloying has been completed, another layer 31 of suitable metal such as high purity aluminum is deposited over the entire surface of the glass layer 28 and into the openings 29 as shown in FIG. 3. The purities of the aluminum should be at least 99.9 percent or above, and preferably 99.99 percent or above. This aluminum layer can have a suitable thickness ranging from 3 to 5 microns and preferably has a thickness of approximately 3.5 microns.

As shown in FIG. 4, a layer 32 of a suitable material such as chromium is deposited on the aluminum layer 31 to a thickness of between 0.2 and 0.4 of a micron and preferably approximately 0.3 of a micron. The chromium is deposited in a suitable manner such as by evaporating the same in a vacuum chamber having the semiconductor wafers therein. Other materials other than chromium can possibly be used. However, it is necessary that the material which is utilized for this layer provide a diffusion barrier between nickel and aluminum. In addition, it must not react with aluminum or nickel to any considerable extent. In addition, the material should be such that it can be etched in the presence of the other metals. The material also should have good chemical resistance. Chromium meets all these criteria and, in addition, has the ability to form a good oxide. In addition, chromium is not easily damaged by the environment.

After the chromium layer 32 has been deposited, another layer 33 formed of a suitable material such as nickel is deposited on the chromium layer 32 ranging from approximately 300 Angstroms to 0.3 of a micron and preferably a thickness of approximately 1,000 Angstroms or 0.1 of a micron. The nickel layer 33 is preferably placed over the chromium layer 32 as soon as possible to protect the chromium from oxidation when the semiconductor structure is brought out into the normal atmosphere. Thus, it is preferable that the nickel layer be deposited immediately after the chromium layer during the same pump-down in the vacuum chamber.

As shown in FIG. 6, thereafter a layer 34 of a suitable photoresist is formed on the nickel layer 33. By the use of a mask and suitable photolithographic techniques, openings or windows 36 are formed in the photoresist which immediately overlie the contact pads 26 and the openings 29. These openings or windows are used for the bumps or pillars which are to be formed as hereinafter described. It has been found that with the 3½ micron thickness for the base aluminum layer 31, that it is desirable to utilize an opening or window 36 which is approximately 80 microns square. It has been found that this provides the optimum ductility for the bump base.

Bump stand-offs 37 are formed of a suitable material such as nickel to a suitable height such as 12 microns in a suitable manner such as by electroplating. It is desirable that the bump stand-offs 37 be of a height so that they serve as physical spacers between the surface of the device and the leads to which they are bonded. The stand-offs also should be sufficiently thick so that they serve as barriers for the gold utilized in the bump or pillar structures hereinafter described.

It should be appreciated in determining the height which it is desired to grow the bump stand-offs 37 that the bump stand-offs will grow laterally at the same time that they are growing vertically so that the bump height may be determined by the spacing which is provided between the contact pads 26 of the semiconductor structure.

As shown in FIG. 9, a layer 38 of a suitable material such as gold is electroplated onto the nickel stand-offs to a suitable thickness ranging from 5 to 6½ microns and preferably 6 microns. The thickness of this gold layer is determined by the final solder metallurgy which is desired. The gold layer 38 is covered by a layer 39 of tin also electroplated to a suitable thickness as, for example, ranging from 4.5 to 5.1 microns and preferably 5 microns. A final gold layer 41 is then electroplated onto the tin layer 39 to a suitable thickness ranging from 1.4 to 1.6 microns and preferably to a thickness of approximately 1.5 microns. The primary purpose of the gold layer 41 is to protect the tin layer 39 from oxidation. It also protects the tin layer from certain chemical steps which are utilized in the present process.

After the bumps or pillars have been completed as shown in FIG. 10, the protective photoresist layer 34 is removed in a suitable manner such as by rinsing the semiconductor structure in acetone. It will be noted, that the photoresist is removed from beneath the lower extremities of the outer margin of each of the bumps or pillars 42 so that each of the bumps or pillars has a generally mushroom-shape configuration.

Figure 13:
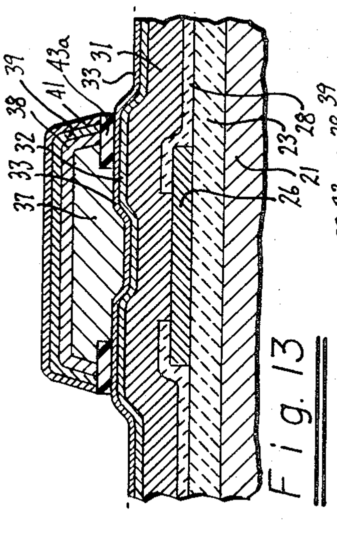
Figure 14:
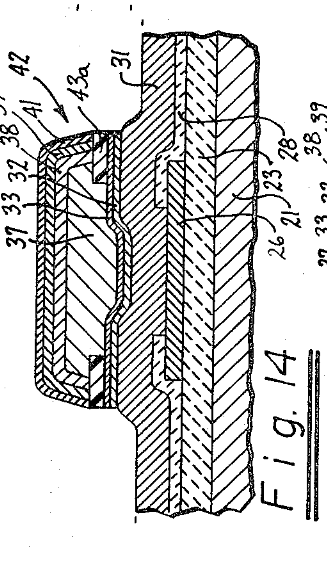
Figure 15:
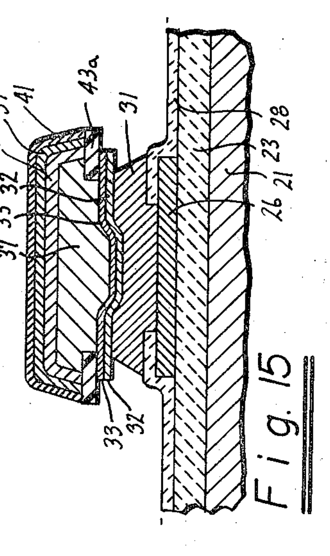

A positive photoresist layer 43 is then formed over the semiconductor structure including the bumps or pillars in a conventional manner such as by flooding the surface of the wafer with Shipley AZ 1,350H and then spinning it at a suitable speed as, for example, 3,000 revolutions per min. for approximately 30 seconds. The photoresist is then baked. As can be seen, the photoresist layer 43 penetrates the regions vacated by the positive photoresist layer 34 and underlies the head portion 42*a* of the bump as shown in FIG. 12. The photoresist is then exposed utilizing a well collimated light source. The photoresist is developed and the portions which have been exposed to light source are removed as shown in FIG. 13 so that there only remains a band 43*a* of photoresist under each of the head portions 42*a* of the bumps 42. The photoresist bands 43*a* provide protection for the exposed tin and nickel.

The exposed portion of the nickel layer 33 is removed by electrolytic etching in a suitable etchant as, for example, 85 percent phosphoric acid. The exposed portion of the chromium layer 32 is then removed in a similar manner. It has been found that this can be accomplished by making the wafer the anode and applying a potential of approximately 4 volts for approximately 1 minute. This removes both the evaporated nickel and chromium layers up to the region covered by the photoresist band 43*a*. A small amount of the aluminum layer may also be removed. However, this can be readily controlled by removing the wafer from the bath at the appropriate time.

The exposed portions of the aluminum layer 31 are then removed in a suitable manner such as by etching the same in an 85 percent phosphoric acid at 55°C. solution with a small amount of a suitable foaming agent. This phosphoric acid which is utilized to etch the aluminum does not cause a further reaction of the chromium or nickel layers 32 and 33. The foaming agent which is utilized provides extremely fine bubbles and serves to limit undercutting.

Figure 16:
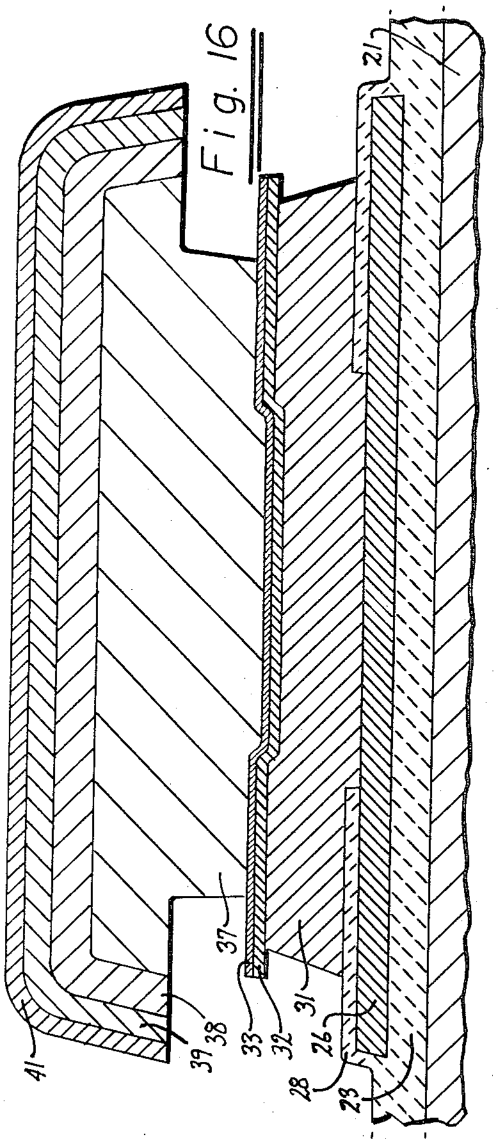
FIGS. 1 – 16 are cross-sectional views showing the steps utilized for fabricating semiconductor structures having bumps or pillars incorporating the present invention.

After the etching operations have been completed, the photoresist rings 43 can be removed by rinsing the wafer in a suitable solution such as acetone. The wafer is then rinsed in deionized water and dried. It is then ready for use, as shown in FIG. 16. A plan view of a portion of such an integrated circuit is shown in FIG. 17 in which the completed spaced discrete bumps or pillars 42 are mounted and connected to the pads 26 which are connected to the lead structure interconnecting the integrated circuit.

Figure 18:
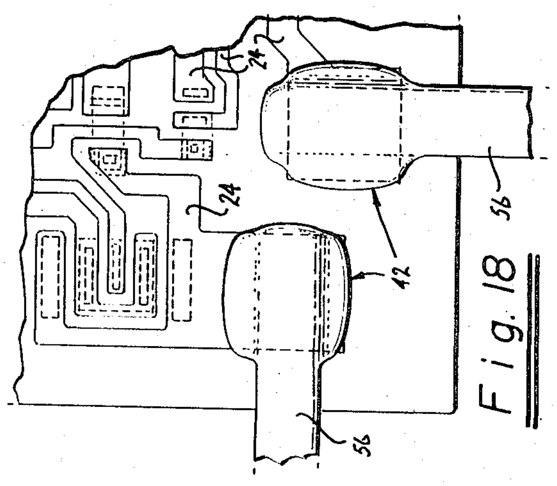
FIG. 18 is a plan view of a portion of an integrated circuit in which the bumps have been secured to the leads leading to the outside world.

The semiconductor structures at this stage are capable of being bonded to lead frames 56 as described in copending application Ser. No. 93,092, As filed Nov. 27, 1970. By way of example, a tin plated steel lead frame can be utilized. As described in said copending application, the bond is completed by bringing the lead frame in contact with the tops of the bumps or pillars in proper alignment and then a hot gas jet is brought over the assembly. The gas is a forming gas mixture with approximately 10 percent hydrogen. The gas jet has a temperature of approximately 500°C. and remains over the assembly from 0.2 to 0.5 of a second to cause gold-tin eutectic to be formed in combination with the tin on the lead frame. Thus the jet melts the solder forming a part of the bumps or pillars, which as soon as the jet is removed hardens to bond the leads of the lead frame simultaneously to all of the bumps or pillars. In FIG. 18, there is shown a plan view of a portion of an integrated circuit having the leads of the lead frame bonded to the pillars or pads in the manner hereinbefore described.

Alternatively, if desired, other types of lead frames can be utilized as, for example, lead frames formed of gold plated Kovar. The gold on the gold-plated Kovar will readily form a bond with the tin-gold system bumps constructed in accordance with the present invention.

After the lead frame has been secured to the integrated circuit chip in the manner hereinbefore described, it can be encapsulated in a suitable manner as, for example, in a plastic package as described in copending application Ser. No. 93,092 filed Nov. 27, 1970. When encapsulating in plastic, it is desirable to utilize a tin-gold system which has a tin-gold eutectic which melts at approximately 280°C.

When it is desired to package the semiconductor structure in a hermetic package of a suitable type such as glass or ceramic, it is necessary to utilize a temperature of 450°C. for approximately 2 – 5 minutes. It is possible to utilize bumps or pillars of the present construction in such temperatures by controlling the thickness of the gold and tin electroplated layers. The initial gold layer 38 serves as a reservior of gold. The thin layers 39 and 41 of tin and gold, respectively, are used to form the gold-tin solder or the composition which will give good wetting and flow during the bonding operation hereinbefore described. Subsequent heat treatment will allow diffusion of the tin into the infinite gold supply provided by the layer 38. The effect is to move the system into the gold region of the gold-tin phase diagram for a gold-tin system. As is well known to those skilled in the art, in a shift towards the gold-rich region, the melting temperature of the composition increases so that at 93 – 95 percent gold, the melting temperature is approximately 495°C. The use of such composition will make it possible to form a bond at a temperature slightly above the 280°C. gold-tin eutectic temperature.

It has been found that bumps or pillars constructed in a manner hereinbefore described are very advantageous since excellent bonds can be achieved with the lead structure. In addition, the bumps or pillars which are formed are relatively ductile and will not readily shear off. It is believed that this has been achieved primarily by the use of the relatively thick aluminum bases 31 which are formed of high purity aluminum. With such a construction, it has been found that it is possible to accommodate 2 – 3 microns of movement without damage to the bump or pillar. This feature is particularly advantageous during thermal cycling of the semiconductor devices. The bonding system herein described gives much greater reliability on thermal cycling than has been possible with bonding systems utilizing gold wires. In addition, it has been found that there is substantially better thermal conductivity through the leads than through the wires which have been used in the past because the leads have a much greater cross-sectional area. For example, leads can be approximately 4 mils wide and 2 mils thick and come directly to the pad, whereas gold wires are often 0.7 of a mil in diameter and are very long, and for that reason most of the dissipation must be through the package itself. With the present construction it is believed that a major portion of the heat dissipation is through the leads themselves.

Another important feature of the bump or pillar construction herein disclosed are the number of layers which are utilized, each of the which has a distinct purpose. Thus, the deposited glass layer 2 serves to protect the aluminum interconnect lead structure while the thick ductile aluminum layer is being etched to form stress relieving bases. The chromium layer serves to prevent or substantially prevent diffusion of nickel through the aluminum which would destroy the bond at the interface of the glass and the aluminum and also would make the aluminum brittle. The then evaporated nickel serves as an adhesion primer metal and provides a good plating surface. As explained previously, if the nickel were not utilized, the chromium layer would oxidize which would provide relatively weak adherence with any metal directly electroplated onto the chromium layer. The thick nickel stand-off 37 serves to keep the lead which is soldered to the top of the bump from being pressed down to the pad and shorting on the edge of the chip. The gold-tin layers are utilized for the solder composition because it is one which will reflow readily. As explained previously, the first gold layer serves as a gold reservoir whereas the outer tin-gold layers serve to form the initial tin gold eutectic. The tin is covered with the gold so that it will not be exposed to the atmosphere and oxidize.

Thus, it can be seen that each of the layers has a relatively distinct and important function in the bump or pillar metallurgical system which is utilized. The metallurgical system utilized in the bumps or pillars makes it possible to readily fabricate the same with high yield and also makes it possible to bond the same to lead structures whereby all of the bumps or pillars on the semiconductor chip can be bonded simultaneously to the leads of the lead structure to thereby result in a very substantial saving in labor in the assembly of semiconductor devices into completed packages.

I claim:

1. In a semiconductor structure, a semiconductor body having a planar surface and having metallic contact pads formed over said surface, a layer of insulating material overlying said contact pads, said layer of insulating material having windows therein overlying said contact pads and exposing said pads, relatively thick ductile bases of solely one metal formed on said layer of insulating material and extending above said layer of insulating material and also extending through said windows and making contact with said contact pads, metallic stand-offs secured to said bases and having a top surface extending a substantial distance above said bases, layers of metal in direct contact with the ductile bases to serve as diffusion barriers between the stand-offs and the ductile bases, said layers of metal in direct contact with the ductile bases being of a type which will not substantially react with the metals of the ductile bases or the metals of the stand-offs so that the ductile bases will retain the characteristics of said one metal and solder formed on said stand-offs, said solder being spaced from said bases, said stand-offs and said solder in combination forming spaced discrete bumps on said contact pads.

2. A structure as in claim 1 wherein said bases are formed of aluminum and wherein said solder includes gold.

3. A structure as in claim 2 wherein said stand-offs are formed of a material which will prevent the migration of the gold into the aluminum.

4. A structure as in claim 3 wherein said stand-offs are formed of nickel.

5. A structure as in claim 4 together with additional metal layers adherent to said stand-offs and to said layer in direct contact with the ductile bases.

6. A structure as in claim 1 wherein said layers in direct contact with the ductile bases are formed of chromium.

7. A structure as in claim 6 wherein said additional layers are formed of nickel.

8. A structure as in claim 1 wherein said bumps have a mushroom-like configuration.

9. A structure as in claim 2 wherein said aluminum bases have a thickness ranging from 3 to 5 microns.

10. A structure as in claim 9 wherein said aluminum bases have a thickness of approximately 3.5 microns.

11. A structure as in claim 6 wherein said chromium layer has a thickness of 0.2 to 0.4 microns.

12. A structure as in claim 11 wherein said chromium layer has a thickness of approximately 0.3 microns.

13. A structure as in claim 7 wherein said nickel layer has a thickness of approximately 1 micron.

14. A structure as in claim 1 wherein said stand-offs have a size of approximately 80 microns square.

15. A structure as in claim 1 wherein said stand-offs have a height of approximately 12 microns.

16. A structure as in claim 1 wherein said solder is formed of gold-tin layers with a gold layer in contact with the stand-off, a tin layer in contact with the gold layer and an additional gold layer in contact with the tin layer to protect the tin layer.

17. A structure as in claim 16 wherein said tin layer and said additional gold layer have a relationship such that when heated they form a gold-tin eutectic at temperatures ranging from 280°C to 450°C.

18. A structure as in claim 1 together with leads bonded to said solder, said leads lying in a plane generally parallel to said surface.

* * * * *